United States Patent [19]

Yost et al.

[11] Patent Number: 5,508,233
[45] Date of Patent: Apr. 16, 1996

[54] GLOBAL PLANARIZATION PROCESS USING PATTERNED OXIDE

[75] Inventors: Dennis J. Yost; Patrick M. Martin, both of Dallas, Tex.

[73] Assignee: Texas Instruments Incorporated, Dallas, Tex.

[21] Appl. No.: 329,021

[22] Filed: Oct. 25, 1994

[51] Int. Cl.⁶ .................................................. H01L 21/465
[52] U.S. Cl. ........................................... 437/228; 437/195
[58] Field of Search ................................. 437/194–195, 437/228, 231, 235, 225, 240

[56] References Cited

U.S. PATENT DOCUMENTS 5,192,715  3/1993  Sliwa et al. ............................. 437/195
5,296,092  3/1994  Kim ......................................... 437/231

*Primary Examiner*—George Fourson
*Assistant Examiner*—H. Jey Tsai
*Attorney, Agent, or Firm*—Alan K. Stewart; Richard L. Donaldson; William E. Hiller

[57] ABSTRACT

A method for planarizing the surface of a layer in a semiconductor device includes forming conductor regions 24, 26, and 28 on a layer of the semiconductor device; forming first insulator regions 30, 32, and 34 in gaps between the conductor regions 24, 26, and 28; and forming an insulator layer 40 over the first insulator regions 30, 32, and 34, and over the conductor regions 24, 26, and 28 such that a surface of the insulator layer 40 will be substantially planar.

13 Claims, 1 Drawing Sheet

GLOBAL PLANARIZATION PROCESS USING PATTERNED OXIDE

| Ser. No. | Filing Date |
| --- | --- |
| 08/329,108 | 10/25/94 |

FIELD OF THE INVENTION

This invention generally relates to semiconductor devices and fabrication methods. More specifically, the invention relates to global planarization of semiconductor devices using a patterned insulator.

BACKGROUND OF THE INVENTION

In multilayer semiconductor devices, excess topology or non-planarity is often introduced during fabrication by underlying partial structures, particularly levels of metal, such as metal lines or buses. Insulator layers over the underlying structures generally conform to the topology and introduce the same non-planarity. A result is that stress is introduced onto the device and crevices resulting from the non-planarity collect unwanted particles, both of which are causes for device degradation, such as, for example, short circuits and a concomitant reduction in ultimate yield.

In the prior art, non-planarity problems are alleviated by a procedure known as resist etch back wherein a resist or other conformal material is spun over the non-planar layer having a thickness greater than the highest peak of the non-planar layer with a resulting planar or flat resist surface, regardless of the topology. The resist is then etched back with an etchant which etches the non-planar layer at the same etch rate as the resist until all of the resist has been removed and the former non-planar layer has been planarized.

SUMMARY OF THE INVENTION

Generally, and in one form of the invention, a method for planarizing the surface of a layer in a semiconductor device includes forming conductor regions on a layer of the semiconductor device; forming first insulator regions in gaps between the conductor regions; and forming an insulator layer over the first insulator regions and over the conductor regions such that a surface of the insulator layer will be substantially planar.

This invention provides several advantages. The need for larger depth of focus photo process and longer etch overetches is reduced. The need for doing a blanket resist etch back is eliminated. Etcher loading effects as seen in typical resist etch back processes are prevented. Standard photo processes are used for patterning between leads that are non-critical. Also, potentially cleaner processing than with blanket resist etch back is provided.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
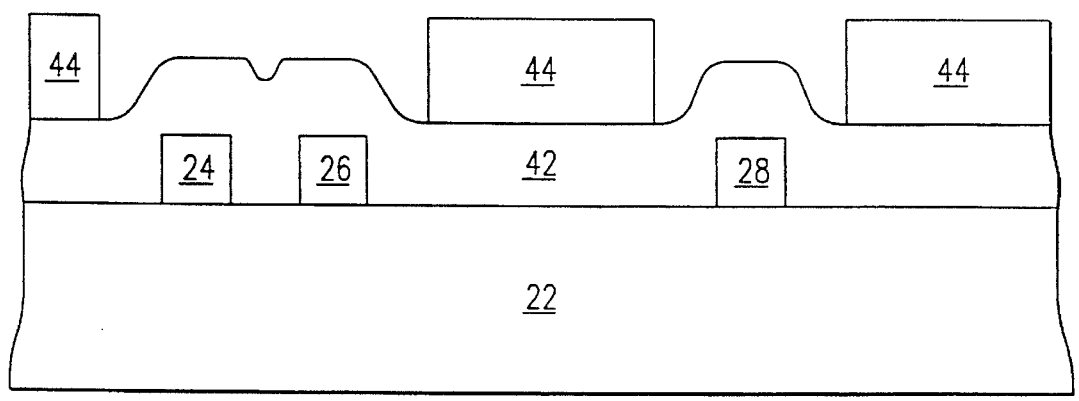
FIGS. 1 through 3 are cross-sectional views showing a first preferred embodiment of the present invention in various states of fabrication.
Figure 2:
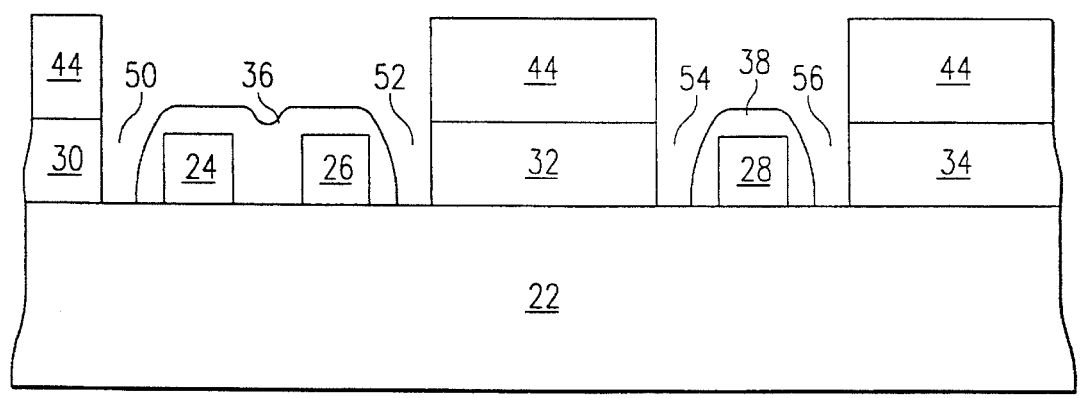
Figure 3:
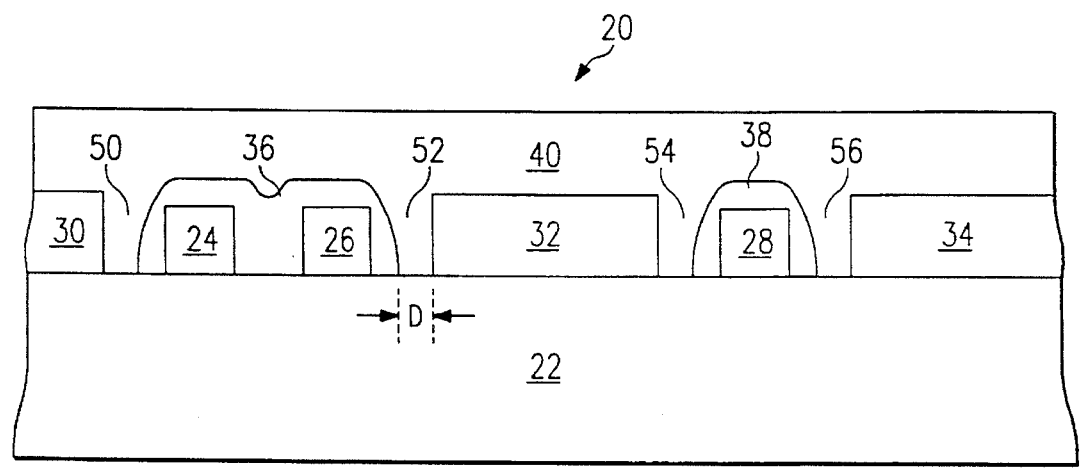

FIGS. 1–3 are cross-sectional diagrams showing a first preferred embodiment of the present invention and a method for forming the same. In FIGS. 1 through 3, a simplified process for planarization using a patterned insulator to fill the large gaps between conducting leads is shown. The circuit 20, shown in FIG. 3, is the completed structure of the first preferred embodiment. The circuit 20 includes region 22 which may contain semiconductor regions, insulator regions, and conductor regions; conductor regions 24, 26, and 28, insulator regions 30, 32, and 34, insulator regions 36 and 38, and insulator layer 40. Region 22 may contain semiconductor components such as transistors, capacitors, diodes, and resistors.

Referring to FIG. 1, there is shown a portion of a typical wafer under fabrication which includes region 22. A conductor layer is deposited over the surface of region 22, and patterned and etched to form conductor regions (metal) 24, 26, and 28. An insulator layer (oxide) 42 is formed over the conductor regions 24, 26, and 28 and over the region 22 in the areas where there are no conductor regions. The insulator layer 42 is deposited on the surface to a thickness of at least the thickness of the conductor regions 24, 26, and 28. In the preferred embodiment shown in FIG. 1, the thickness of the insulator layer 42 is slightly more than the thickness of the conductor regions 24, 26, and 28. A typical insulator layer thickness is on the order of 0 to 2000 Angstroms greater than the thickness of the conductor regions 24, 26, and 28. Since the insulator layer 42 substantially tracks the topology below, the surface of insulator layer 42 is non-planar.

In order to eliminate this non-planarity, as shown in FIG. 1, insulator layer 42 is patterned to form insulator regions 30, 32, and 34 in the large spaces between the conductor regions. Photoresist 44 is patterned, exposed, and developed to leave a pattern in between the conductor regions, as shown in FIG. 1. For the closely spaced conductor regions such as regions 24 and 26, the space between the conductor regions is not patterned. After completion of the pattern, the insulator layer 42 is anisotropically etched, as shown in FIG. 2. Then the photoresist 44 is removed. The amount of insulator etched is equal to or slightly less than the thickness of insulator layer 42. This then fills in the large spaces in between the conductor regions 24, 26, and 28 with insulator regions 30, 32, and 34. The insulator regions 30, 32, and 34 are approximately the same height as the conductor regions 24, 26, and 28, as shown in FIG. 2. The resulting gaps 50, 52, 54, and 56, shown in FIG. 2, are then easily filled by conventional gap filling techniques such as spin-on-glass, high pressure ozone TEOS, and dep-etch-dep oxide. The resulting surface is then globally planarized and conventional local planarization techniques such as spin-on-glass, high pressure ozone TEOS, and dep-etch-dep oxide can be used to finish the planarization. The gaps 50, 52, 54, and 56 are filled by insulator layer 40, as shown in FIG. 3.

For this process applied to a 0.5 micron design rule which is currently applied to components such as 16 MEG DRAMs, the gap dimension D is on the order of one to three microns.

The embodiment described above provides a simplified process for planarization using a patterned insulator to fill the large gaps between conducting leads to improve global planarization. This embodiment reduces the need for larger depth of focus photo process and longer etch overetches. The need for doing a blanket resist etch back is eliminated. Etcher loading effects as seen in typical resist etch back processes are prevented. Standard photo processes are used for patterning between leads that are non-critical. Also, this embodiment provides potentially cleaner processing than with blanket resist etch back.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:

1. A method for planarizing a surface of a layer in a semiconductor device comprising:

forming conductor regions on a layer of the semiconductor device;

forming a first insulator layer over and between the conductor regions;

etching the first insulator layer to form insulator regions between the conductor regions, and forming gaps between the insulator regions and the conductor regions, and leaving portions of the first insulator layer over the conductor regions after etching; and forming a second insulator layer over the insulator regions and over the conductor regions such that a surface of the second insulator layer will be planar.

2. The method of claim 1 wherein photoresist is used to pattern the etch of the first insulator layer.

3. The method of claim 1 wherein the first insulator layer is oxide.

4. The method of claim 1 wherein the conductor regions are metal.

5. The method of claim 1 wherein the first insulator layer is between 0 and 2000 angstroms thicker than the conductor regions.

6. The method of claim 1 wherein the insulator regions are separated from the portions of the first insulator layer over the conductor regions.

7. The method of claim 6 wherein the insulator regions are separated from the portions of the first insulator layer by one to three microns.

8. The method of claim 1 wherein the second insulator layer is oxide.

9. A method for planarizing a surface of a layer in a semiconductor device comprising:

forming conductor regions on a layer of the semiconductor device;

forming first insulator regions between the conductor regions;

forming second insulator regions over the conductor regions and separated from the first insulator regions; and forming an insulator layer over the first and second insulator regions such that a surface of the insulator layer will be planar.

10. The method of claim 9 wherein the first insulator regions are oxide.

11. The method of claim 9 wherein the conductor regions are metal.

12. The method of claim 9 wherein the insulator layer is oxide.

13. The method of claim 9 wherein the second insulator regions are oxide.

* * * * *